US008890198B2

(12) United States Patent
Ho et al.

(10) Patent No.: US 8,890,198 B2
(45) Date of Patent: Nov. 18, 2014

(54) CONVERSION STRUCTURE, IMAGE SENSOR ASSEMBLY AND METHOD FOR FABRICATING CONVERSION STRUCTURE

(71) Applicant: Architek Material Co., Ltd., New Taipei (TW)

(72) Inventors: Shu-Lin Ho, Taoyuan County (TW); Pao-Yun Tang, Taoyuan County (TW); Kei-Hsiung Yang, Taoyuan County (TW)

(73) Assignee: Architek Material Co., Ltd., Tucheng Dist., New Taipei (TW)

( * ) Notice: Subject to any disclaimer, the term of this patent is extended or adjusted under 35 U.S.C. 154(b) by 52 days.

(21) Appl. No.: 13/861,406

(22) Filed: Apr. 12, 2013

(65) Prior Publication Data

US 2014/0197510 A1 Jul. 17, 2014

(30) Foreign Application Priority Data

Jan. 15, 2013 (TW) .............................. 102101577 A

(51) Int. Cl.
H01L 33/00 (2010.01)
H01L 31/0232 (2014.01)

(52) U.S. Cl.
CPC ................ *H01L 31/02327* (2013.01)
USPC .................................... 257/98; 257/E33.073

(58) Field of Classification Search
CPC ............................................. H01L 31/02327
USPC ............................................ 257/98, E33.073
See application file for complete search history.

(56) References Cited

U.S. PATENT DOCUMENTS

| 2007/0069141 | A1 | 3/2007 | Nittoh |
| 2012/0146077 | A1* | 6/2012 | Nakatsu et al. ................. 257/98 |
| 2013/0049049 | A1* | 2/2013 | Choi ............................... 257/98 |
| 2014/0103798 | A1* | 4/2014 | Yamanaka et al. ............ 313/512 |
| 2014/0124812 | A1* | 5/2014 | Kuramoto et al. .............. 257/98 |

FOREIGN PATENT DOCUMENTS

| CN | 1886675 A | 12/2006 |
| EP | 1 422 559 B1 | 1/2007 |
| EP | 2 207 047 A2 | 7/2010 |
| TW | 200608315 | 3/2006 |
| TW | 200731838 | 8/2007 |
| TW | 200814309 | 3/2008 |
| TW | 201111825 | 4/2011 |
| TW | 201246597 | 11/2012 |
| TW | 201300791 | 1/2013 |

\* cited by examiner

*Primary Examiner* — Trung Q Dang
(74) *Attorney, Agent, or Firm* — Winston Hsu; Scott Margo

(57) ABSTRACT

An electromagnetic wave conversion structure consists of a substrate, a plurality of electromagnetic wave conversion units forming a two-dimensional array, a reflective film and a plurality of reflective layers. The substrate has a first surface and a second surface disposed opposite to the first surface. The second surface consists of a plurality of trenches formed in the body of the substrate. Each electromagnetic wave conversion units is disposed in each trench, is used to absorb first electromagnetic waves with a first wavelength and is used to emit second electromagnetic waves with a second wavelength. The first wavelength is shorter than the second wavelength. The reflective film covers the first surface of the substrate and is used to reflect the second electromagnetic wave. Each of the reflective layers is disposed on the sidewall of each trench of the corresponding electromagnetic wave conversion unit.

14 Claims, 12 Drawing Sheets

US 8,890,198 B2

CONVERSION STRUCTURE, IMAGE SENSOR ASSEMBLY AND METHOD FOR FABRICATING CONVERSION STRUCTURE

BACKGROUND OF THE INVENTION

1. Field of the Invention

The present invention generally relates to the field of electromagnetic wave sensor assemblies, and more particularly, to a conversion structure, an image sensor assembly and a method of fabrication a conversion structure.

2. Description of the Prior Art

With the advent of the aging society, the focus on the development of methods for preventive medicare has attracted much attention, especially to the development of equipments for medical diagnostic imaging due to its high technical threshold, high value-added benefit and non-invasive properties. Generally, the types of the medical diagnostic imaging equipments include X-rays systems, electrocardiography (ECG) systems, ultrasonic diagnostic systems, computed tomography (CT) systems, magnetic resonance imaging (MRI) systems, and so forth. Among these types of equipments, X-ray and computed tomography systems are widely used in various medical fields, such as dentistry, orthopedics, chest medicine x-ray radiography and so on.

Generally, the diagnostic X-ray systems and the computed tomography systems are equipped with an X-rays image sensor assembly so as to convert the X-ray beams penetrating through a human body into corresponding electric signals. The electric signals are then transmitted into circuits and calculated by a processor respectively. In a conventional X-rays image sensor assembly, a conversion structure and a light sensor assembly are incorporated as parts of the X-rays image sensor assembly. The conversion structure can convert X-rays into electromagnetic waves which are detectable by the light sensor assembly. The light sensor assembly can further convert the electromagnetic waves into the corresponding electric signals. The conversion structure described above generally uses a scintillator as a material for converting X-rays into the electromagnetic waves and the composition of the scintillator is usually cesium iodide doped with thallium (CsI:Tl).

However, there are many drawbacks when using scintillators as main active components in the X-rays image sensor assemblies. For example, in order to prevent toxic heavy metals, i.e. Tl, from causing environmental pollution and from negatively affecting human health, expensive waste gas filtration systems are required for the process of manufacturing the scintillator. In addition, in order to prevent light scattering when the light passes through the scintillator and to improve the resolution of the image sensor assembly, an epitaxial growth process is required, so as to provide an anti-scatter CsI:Tl pillar structure. Furthermore, Tl and CsI can not be mixed uniformly due to their inherent material properties. That is to say, Tl is unevenly distributed within CsI:Tl and causes bad light conversion efficiency. Besides, since CsI:Tl is prone to deliquescence, the sealing degree of the corresponding image sensor assembly needs to be well controlled.

Therefore, there is a need to provide a conversion structure, an image sensor assembly and a method of fabrication a conversion structure that can overcome the above-mentioned drawbacks.

SUMMARY OF THE INVENTION

To this end, one purpose of the present invention is to provide a conversion structure, an image sensor assembly and a method for fabricating a conversion structure that overcome the drawbacks caused by using CsI:Tl as scintillator.

According to an embodiment of the present invention, an electromagnetic wave conversion structure is provided. The electromagnetic wave conversion structure consists of a substrate, a plurality of electromagnetic wave conversion units forming a two-dimensional array, a reflective film and a plurality of reflective layers. The substrate has a first surface and a second surface disposed opposite to the first surface. The second surface consists of a plurality of trenches formed in the body of the substrate. Each electromagnetic wave conversion unit is disposed in each of the trenches, and is used to absorb a first electromagnetic wave with a first wavelength and to emit a second electromagnetic wave with a second wavelength. The first wavelength is shorter than the second wavelength. The reflective film, which is transparent or semi-transparent to the first electromagnetic wave, covers the first surface of the substrate and is used to reflect the second electromagnetic wave. Each of the reflective layers used to reflect the second electromagnetic wave is disposed on the sidewall of each trench of the corresponding electromagnetic wave conversion unit.

According to another embodiment of the present invention, an image sensor assembly is provided. The image sensor assembly includes a conversion structure and a light sensor assembly. The conversion structure includes a first substrate, a plurality of electromagnetic wave conversion elements, a reflective film, and a plurality of reflective layers. The first substrate has a first surface and a second surface opposite to the first surface, wherein the second surface of the substrate has a plurality of trenches penetrating the substrate. The electromagnetic wave conversion elements are respectively disposed in each of the trenches, wherein each of the electromagnetic wave conversion elements is used to absorb a first electromagnetic wave having a first electromagnetic wave wavelength and to emit a second electromagnetic wave having a second electromagnetic wave wavelength, wherein the first electromagnetic wave wavelength is shorter than the second electromagnetic wave wavelength. The reflective film covers the first surface of the substrate, wherein the first electromagnetic wave penetrates the reflective film, and the reflective film is used to reflect the second electromagnetic wave. The reflective layers are respectively disposed between a sidewall of each of the trenches and each of the electromagnetic wave conversion elements, wherein the reflective layers are used to reflect the second electromagnetic waves. The light sensor assembly is disposed opposite to the second surface of the first substrate and includes a plurality of sensing regions. The light sensor assembly includes a second substrate and a plurality of light sensor devices. The light sensor devices are respectively disposed within each of the sensing regions on the second substrate.

According to still another embodiment of the present invention, a method for fabricating a conversion structure is provided. The method includes the following steps. First, a substrate having a first surface and a second surface opposite to the first surface is provided. A plurality of trenches penetrating the substrate is formed on the second surface. A reflective film is formed to cover the first surface of the substrate. A reflective layer is formed on the sidewall of each of the trenches. An electromagnetic wave conversion element is filled into each of the trenches, wherein each electromagnetic wave conversion element is used to absorb a first electromagnetic wave having a first electromagnetic wave wavelength and to emit a second electromagnetic wave having a second electromagnetic wave wavelength, and the first electromagnetic wave wavelength is shorter than the second electromagnetic wave wavelength.

The present invention provides a conversion structure, an image sensor assembly and a method for fabricating a conversion structure. Since the currently used epitaxial growth processes and toxic materials are all replaced in the present invention, the corresponding process can be more convenient and eco-friendly. In addition, owing to the specific geometric design of the conversion structure trench and the existence of the reflective film and the reflective layer, the intensity of light having a second wavelength and outputted from the conversion structure into the light sensor assembly can be increased accordingly. In this way, the change in light intensity can be determined by the light sensor devices more easily so as to overcome the drawbacks usually associated to CsI:Tl, such as relatively low light conversion efficiency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
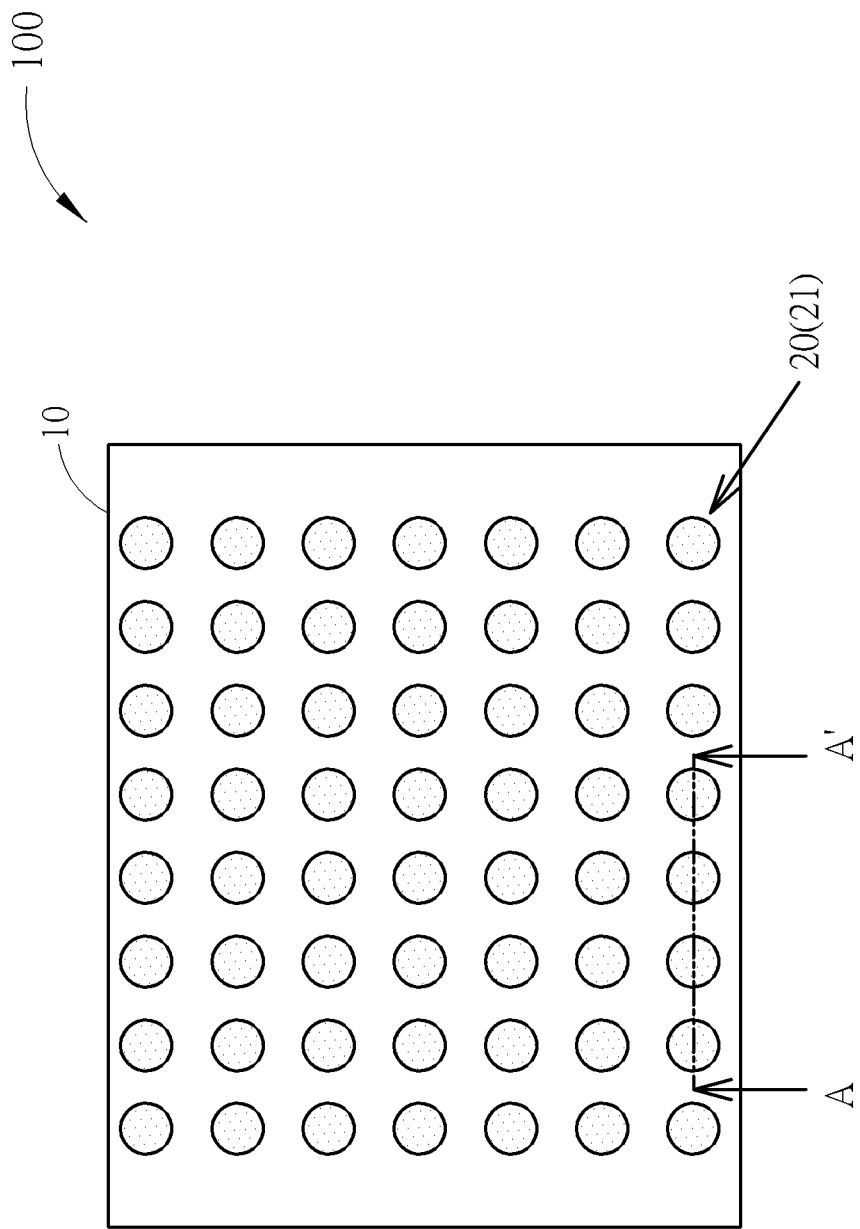
FIG. 1 is a schematic top view showing a conversion structure according to an embodiment of the present invention.

In the following description, numerous specific details are given to provide a thorough understanding of a conversion structure, an image sensor assembly and a method for fabricating a conversion structure related to the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing the embodiments of the apparatus are not to scale and some dimensions are exaggerated for clarity of presentation. Also, when multiple embodiments are disclosed and described as having some features in common, like or similar features will usually be described with same reference numerals for ease of illustration and description thereof.

Figure 2:
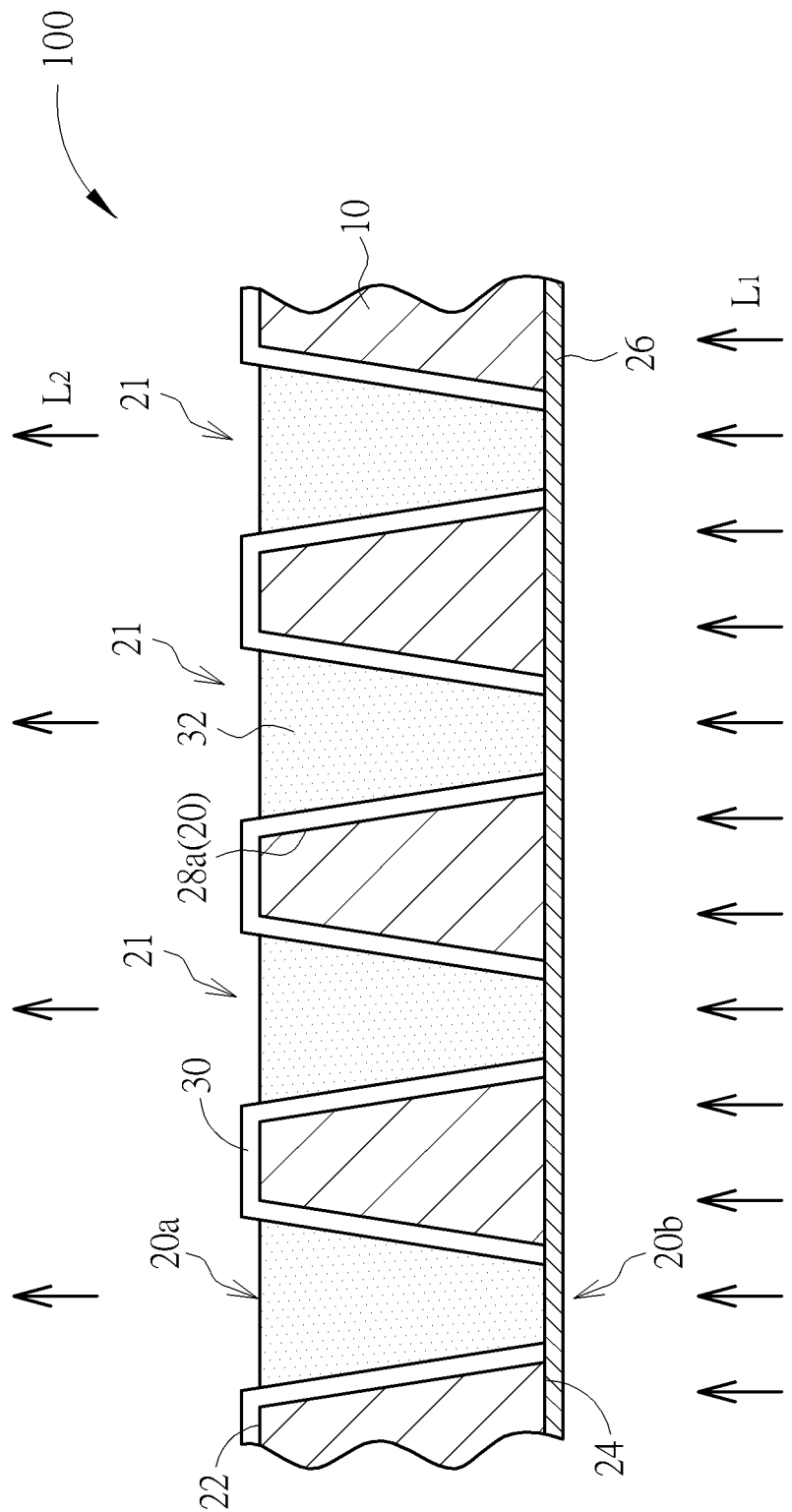
FIG. 2 is a schematic cross-sectional diagram taken along a line A-A' in FIG. 1 according to an embodiment of the present invention.

Please refer to FIG. 1 and FIG. 2. FIG. 1 is a schematic top view showing a conversion structure according to an embodiment of the present invention. FIG. 2 is a schematic cross-sectional diagram taken along a line A-A' in FIG. 1 according to an embodiment of the present invention. As shown in FIG. 1 and FIG. 2, the present embodiment provides a conversion structure 100. The conversion structure 100 includes a substrate 10, a plurality of conversion units 21 and a reflective film 26. The substrate 10 has a first surface 24 and a second surface 22 and includes a rigid substrate (such as semiconductor substrate, glass-fiber substrate, glass substrate, rigid plastic substrate, metal substrate or ceramic substrate), a flexible substrate or other substrate with suitable materials, but not limited thereto. The conversion units 21 are disposed in the substrate 10 and are arranged in an array layout. Preferably, the pitch between two adjacent conversion units 21 is the same. For example, the pitch between two adjacent conversion units 21 may range from 20 micrometer (μm) to 200 μm, and preferably ranging from 50 μm to 100 μm, but not limited thereto. Besides, the pitch between the conversion units 21 in two adjacent columns may be equal to or unequal to the pitch between the conversion units 21 in two adjacent rows, if required. The reflective film 26 may cover the first surface 24 of the substrate 10.

To put it more concretely, each of the conversion units 21 disclosed in the present embodiment preferably includes a trench 20, a reflective layer 30 and an electromagnetic wave conversion element 32. That is to say, the second surface 22 of the substrate 10 includes a plurality of trenches 20. The trenches 20 may penetrate the substrate 10 and each of the trenches 20 includes a first opening 20a and a second opening 20b. The first openings 20a and the second openings 20b are respectively located on the second surface 22 and the first surface 24. According to one preferred embodiment, the opening shape of the first opening 20a is preferably a circle, but not limited thereto. Each trench 20 includes a sidewall 28a, which may be a vertical sidewall or non-vertical sidewall. In order to increase light concentrating ability, the sidewall 28a of the trench 20 is preferably not perpendicular to the second surface 22, and an angle between the sidewall 28a and the second surface 22 is higher than 90 degrees, but not limited thereto. The reflective layer 30 is disposed on the sidewall 28a and can reflect specific electromagnetic waves from the electromagnetic wave spectrum. The reflective layer 30 preferably covers the entire sidewall 28a and extends to the entire second surface 22, but not limited thereto. The electromagnetic wave conversion element 32 is disposed in each trench 20 and the component of the electromagnetic wave conversion elements 32 may include scintillator, phosphor materials, phosphorescent materials and other materials suitable for converting electromagnetic wave wavelength. The relevant characteristic will be described in detail in the following paragraphs. For example, according to one embodiment of the present invention, at the beginning of the electromagnetic wave conversion process, a first electromagnetic wave L1 having first wavelength is emitted into the electromagnetic wave conversion elements 32 from the first surface 24 of the substrate 10. The first electromagnetic wave L1 may be absorbed by the electromagnetic wave conversion elements 32 and further be converted into a second electromagnetic wave L2 having second wavelength. Afterward, the second electromagnetic wave L2 is emitted from the second surface 22 of the substrate 10. The first wavelength is shorter than the second wavelength, which means that the energy of the first electromagnetic wave L1 is higher than that of the second electromagnetic wave L2. For example, when a first electromagnetic wave has a first wavelength and is chosen from one of the Gamma ray, X-ray, ultraviolet light, visible light or infrared light, a second electromagnetic wave may has a second wavelength that is longer than the first wavelength. When the first electromagnetic wave L1 enters the electromagnetic wave conversion elements 32, it can be absorbed by the electromagnetic wave conversion elements 32 and be converted into the second electromagnetic wave L2. The second electromagnetic wave L2 may be reflected by the reflective film 26 and the reflective layer 30 so that it can emit from the second surface 22 of the substrate 10. It should be noted that the reflective film 26 and the reflective layer 30 preferably reflect the second electromagnetic wave L2 having the second wavelength only. In contrast, the first electromagnetic wave L1 having the first wavelength may penetrate the reflective film 26. Additionally, in order to increase the light intensity of the second electromagnetic wave L2, the sidewall 28a of each of the trenches 20 is preferably a non-vertical sidewall so that an opening area of the first opening 20a is larger than an opening area of the second opening 20b. According to the reflection ability of the reflective film 26 and the reflective layer 30, and the geometric shape of the sidewall 28a, the second electromagnetic wave L2 can be concentrated and be emitted from the second surface 22 of the substrate 10.

According to one embodiment of the present invention, the first wavelength is preferably from the X-rays spectrum, while the second wavelength is preferably from the visible spectrum. Therefore, the electromagnetic wave conversion element 32 is a kind of X-ray phosphors, also-called scintillator, which can absorb X-rays and emit visible light. Generally, The material of the scintillator includes $Gd_2O_2S$ doped with Tb, Eu, Pr, Ce, F or other suitable dopants, such as $Gd_2O_2S$:Eu, $Gd_2O_2S$:Pr, $Gd_2O_2S$:Pr,Ce,F, $La_2O_2S$ doped with Eu, Tb or other suitable dopants, such as $La_2O_2S$:Eu, $La_2O_2S$:Tb, $Y_2O_2S$ doped with Tb or other suitable dopants, such as $Y_2O_2S$:Tb, CsI doped with Tl, Na or other suitable dopants, such as CsI:Tl, CsI:Na, doped LaOBr, doped $Zn_{0.6}Cd_{0.4}S$, doped $CaWO_4$ and so forth, but not limited thereto. However, according to other embodiments of the present invention, the electromagnetic wave conversion elements may adopt other kinds of X-ray phosphors, which can absorb X-rays and emit electromagnetic waves having wavelength longer than X-rays, such as infrared lights or ultraviolet lights. Compared with current conversion structures having CsI:Tl, the present invention provides electromagnetic wave conversion elements 32 in the conversion structure 100, wherein each electromagnetic wave conversion element 32 is a well-mixed luminescent material or a phosphorescent material so that a decrease in light conversion efficiency due to uneven mixing does no longer happen. For example, since various portions of the human body may block X-rays at different degrees, when X-rays are emitted upon and through a human body, the energy of X-rays corresponding to various portions of the human body may show corresponding gray images. Consequently, the X-rays with different intensity corresponding to various portions of the human body may enter the conversion structure 100 from the first surface 24 and be converted into the corresponding visible light by the conversion units 21. The visible light having corresponding intensity may be reflected by the reflective layer 30 as well as the reflective film 26, and be emitted from the second surface 22.

Figure 3:
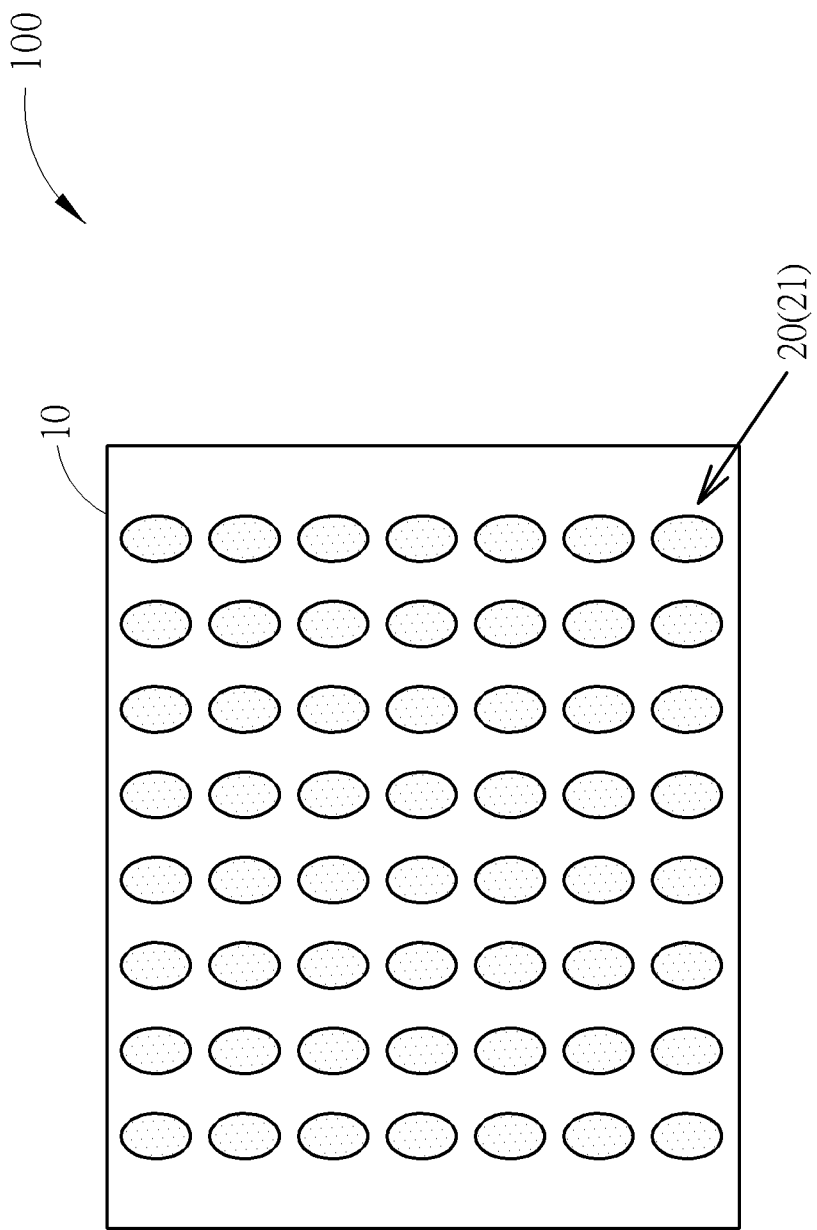
FIG. 3 is a schematic top view showing a conversion structure according to an embodiment of the present invention.

Various conversion structures according to embodiments of the present invention will be described in detail in the following paragraph. It is worth noting that only the main difference will be described in the following paragraphs, and the same reference numbers are used to denote the same or similar components or structures. Please refer to FIG. 3. FIG. 3 is a schematic top view showing a conversion structure according to an embodiment of the present invention. As shown in FIG. 3, one main difference between this embodiment and the previous embodiment is that the opening shape of each of the trenches 20 shown in FIG. 3 is not circular but elliptical. According to other embodiments of the present invention, the opening shape of each trench 20 may also be polygonal, such as triangular, rectangular or square, or a combination thereof.

Figure 4:
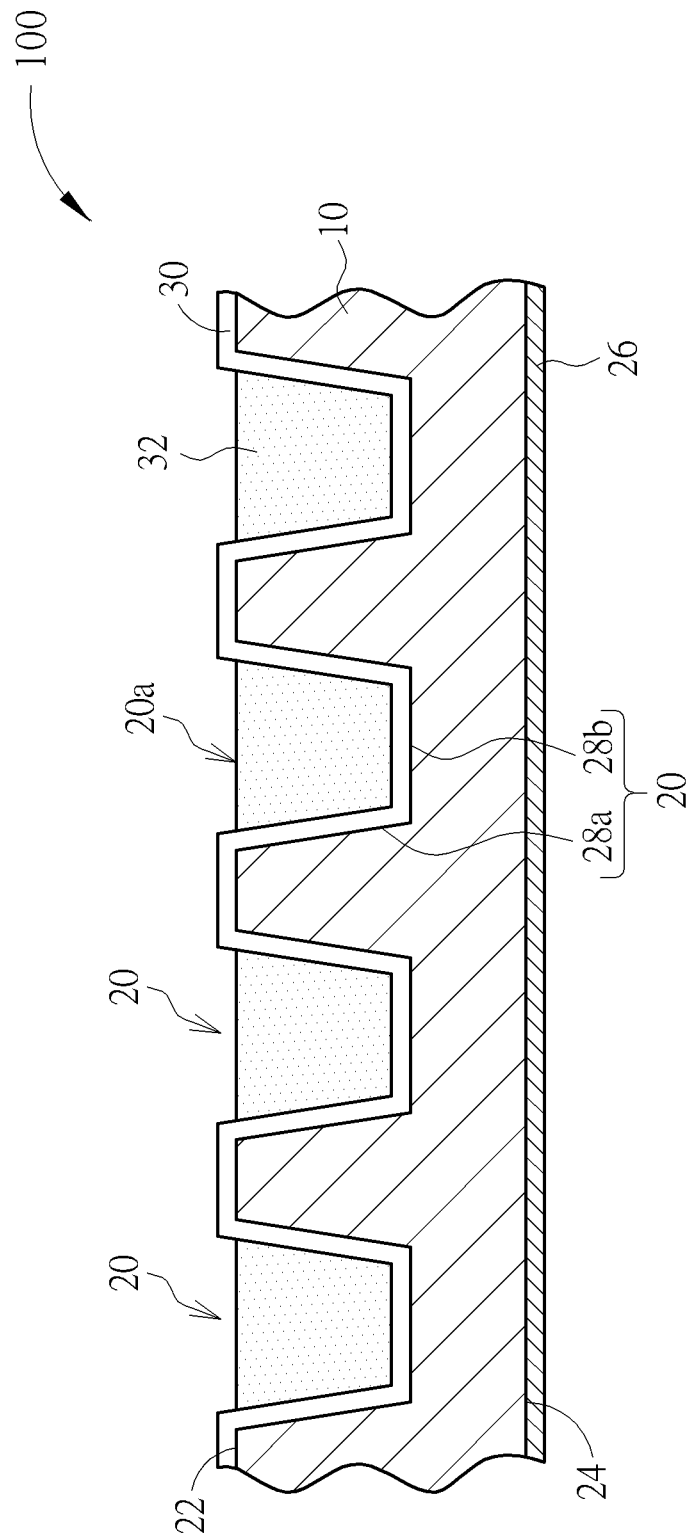
FIG. 4 to FIG. 8 are schematic cross-sectional diagrams taken along a line A-A' in FIG. 1 according to embodiments of the present invention.
Figure 5:
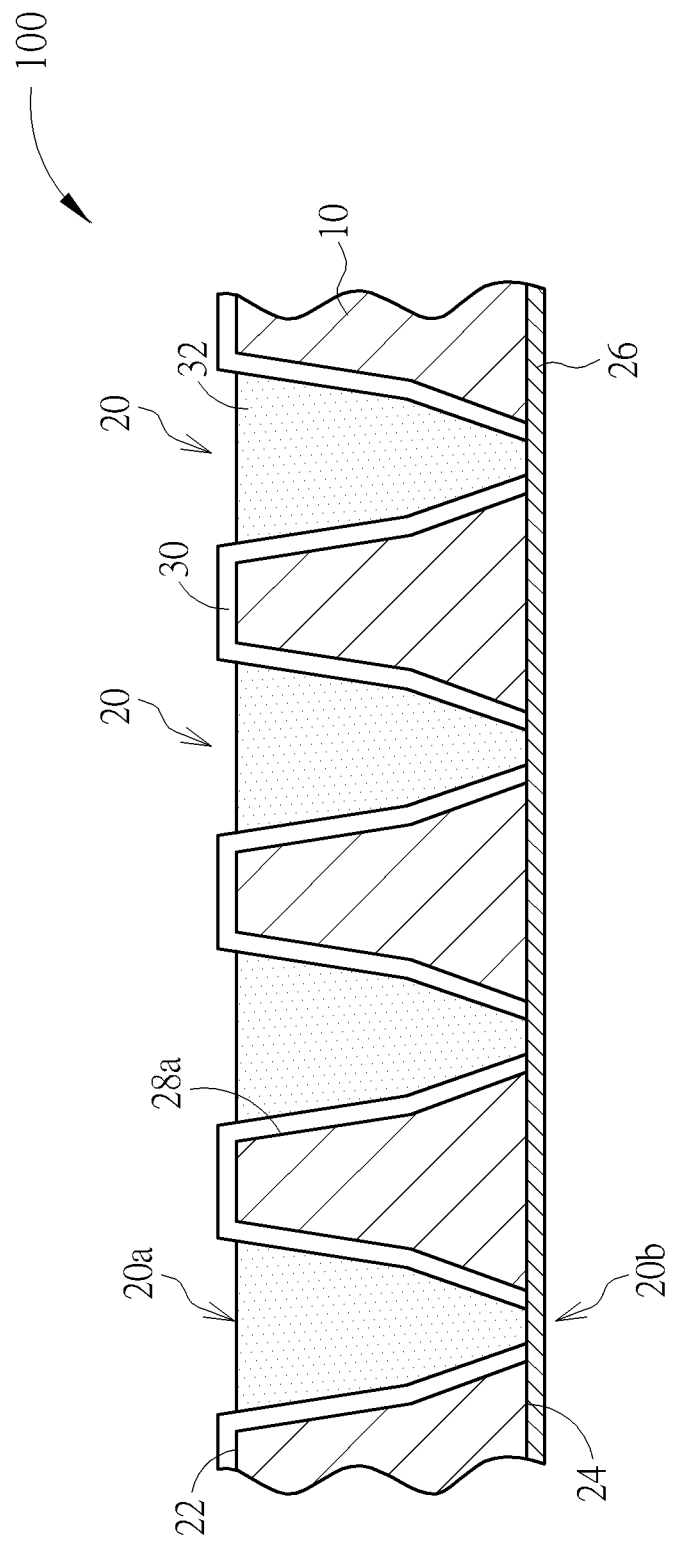

Please refer now to FIG. 4; FIG. 4 is a schematic cross-sectional diagram taken along a line A-A' in FIG. 1 according to one embodiment of the present invention. The main difference between the conversion structure 100 shown in FIG. 4 and FIG. 1 is that each trench 20 disclosed in the present embodiment is not a through hole but a blind via hole. In other words, each of the trenches 20 does not penetrate the substrate 10 and its bottom surface 28b is located inside the substrate 10 without directly contacting the reflective film 26. In addition, since each of the trenches 20 is a blind via hole according to the present embodiment, the material of the substrate 10 is preferably chosen from materials transparent to the first electromagnetic waves L1. For example, when the first electromagnetic waves L1 are chosen from the X-rays spectrum, the substrate 10 is preferably a glass substrate or other kinds of plastic substrates.

Figure 6:
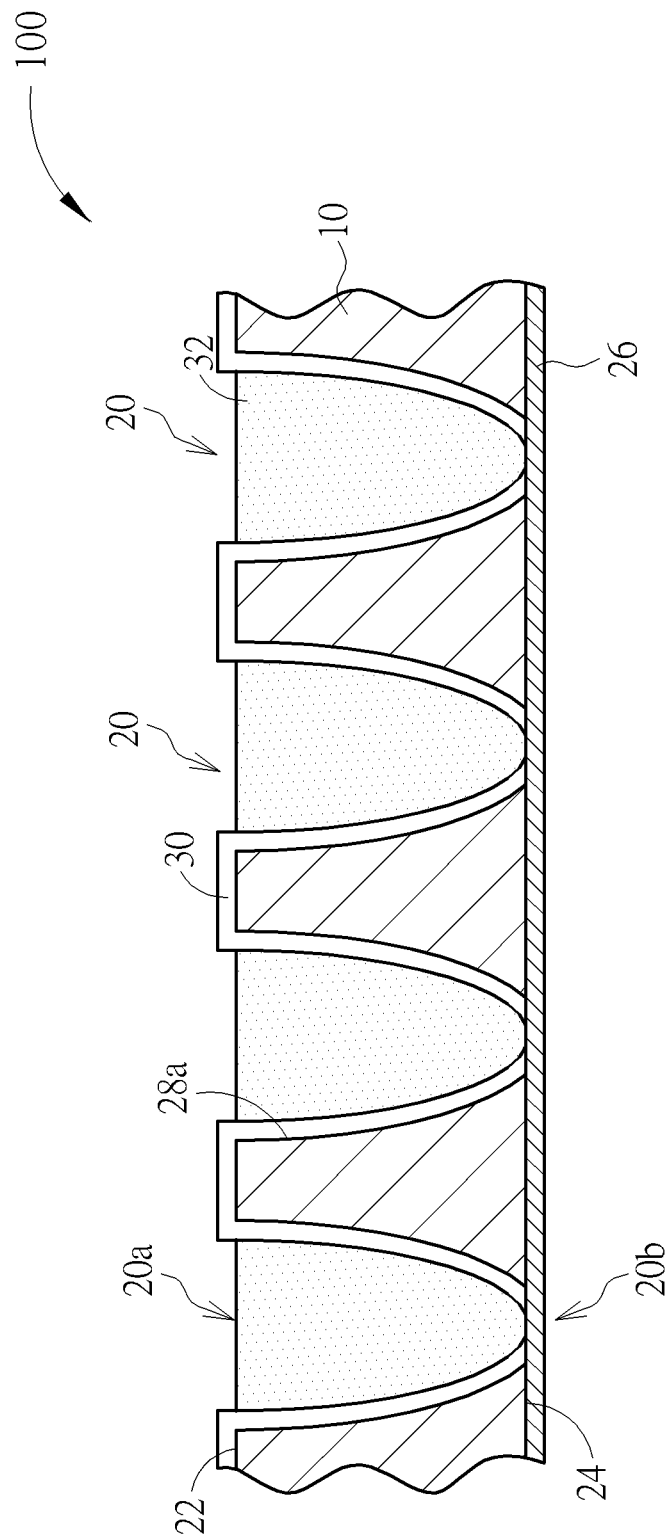
Figure 7:
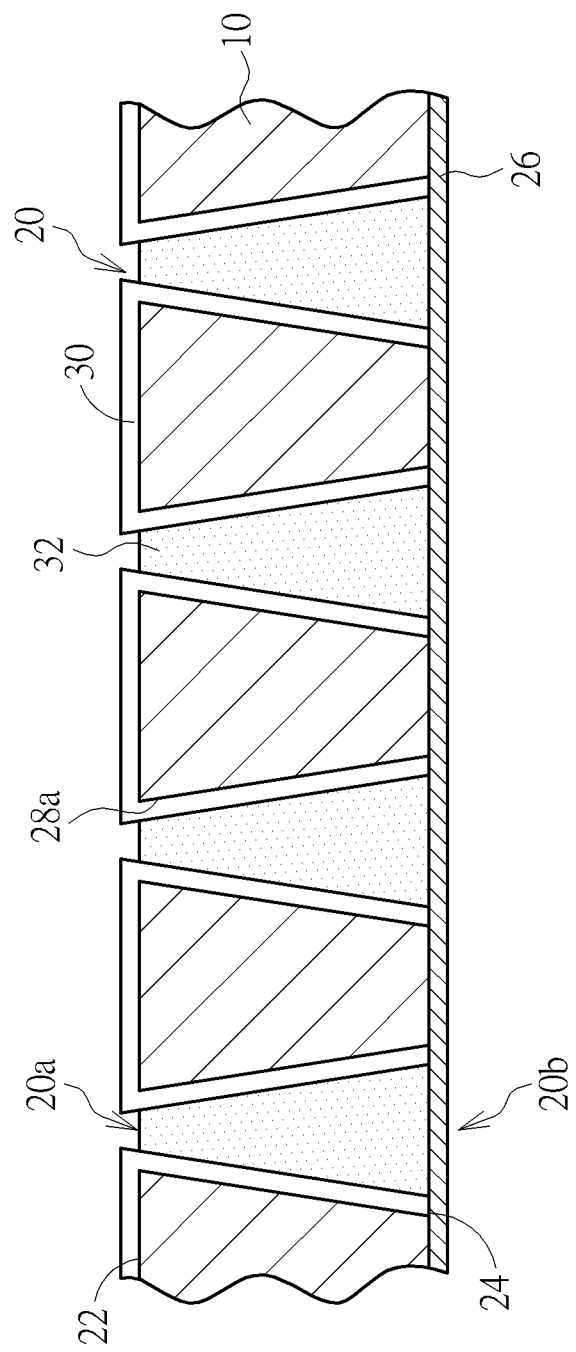
Figure 8:
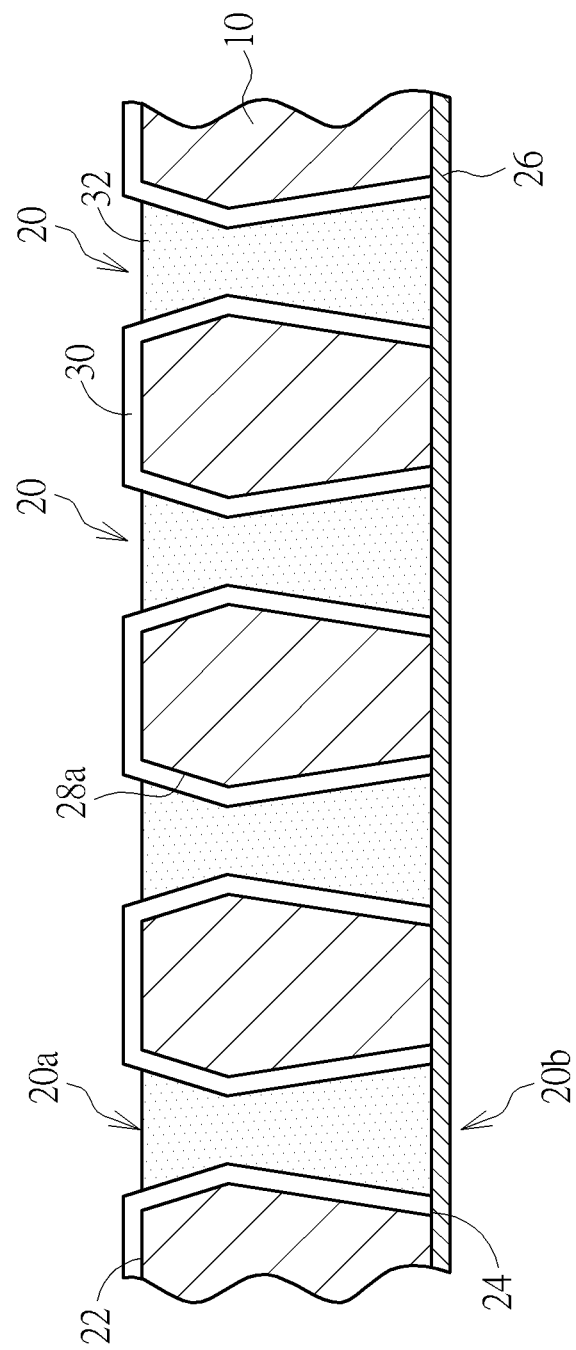

Please refer now to FIG. 5 to FIG. 8; FIG. 5 to FIG. 8 are schematic cross-sectional diagrams taken along a line A-A' in FIG. 1 and respectively show cross-sectional geometric shapes of trenches 20 in the conversion structure 100 according to different embodiments of the present invention. To put it more concretely, according to the cross-sectional diagram of the conversion structure 100 shown in FIG. 5, the sidewall 28a of each of the trenches 20 has a slanted surface with two angles. In this configuration, the second electromagnetic waves L2 shown in FIG. 2 can be concentrated more easily. However, the sidewall 28a of each of the trenches 20 may include a slanted surface with more than two angles according to other embodiments if required. Still, as shown in FIG. 6, the sidewall 28a of each of the trenches 20 may have a curved surface with gradually changing angles for the trenches 20 to have a better light concentrating ability. As shown in FIG. 7, the sidewall 28a of each of the trenches 20 may be slanted in a specific direction so that a first opening 20a of each of the trenches 20 may has an opening area smaller than an opening area of a second opening 20b. Furthermore, as shown in FIG. 8, the sidewall 28a of each trench 20 may be similar to an inversely jointed double truncated cone. The embodiments described above are for illustrative purpose only; the trench disclosed in the present invention may have other cross-sectional geometric shapes. For example, the sidewall of the trenches may have a vertical surface, a concave surface or other surfaces with suitable geometric shapes, but not limited thereto.

Figure 9:
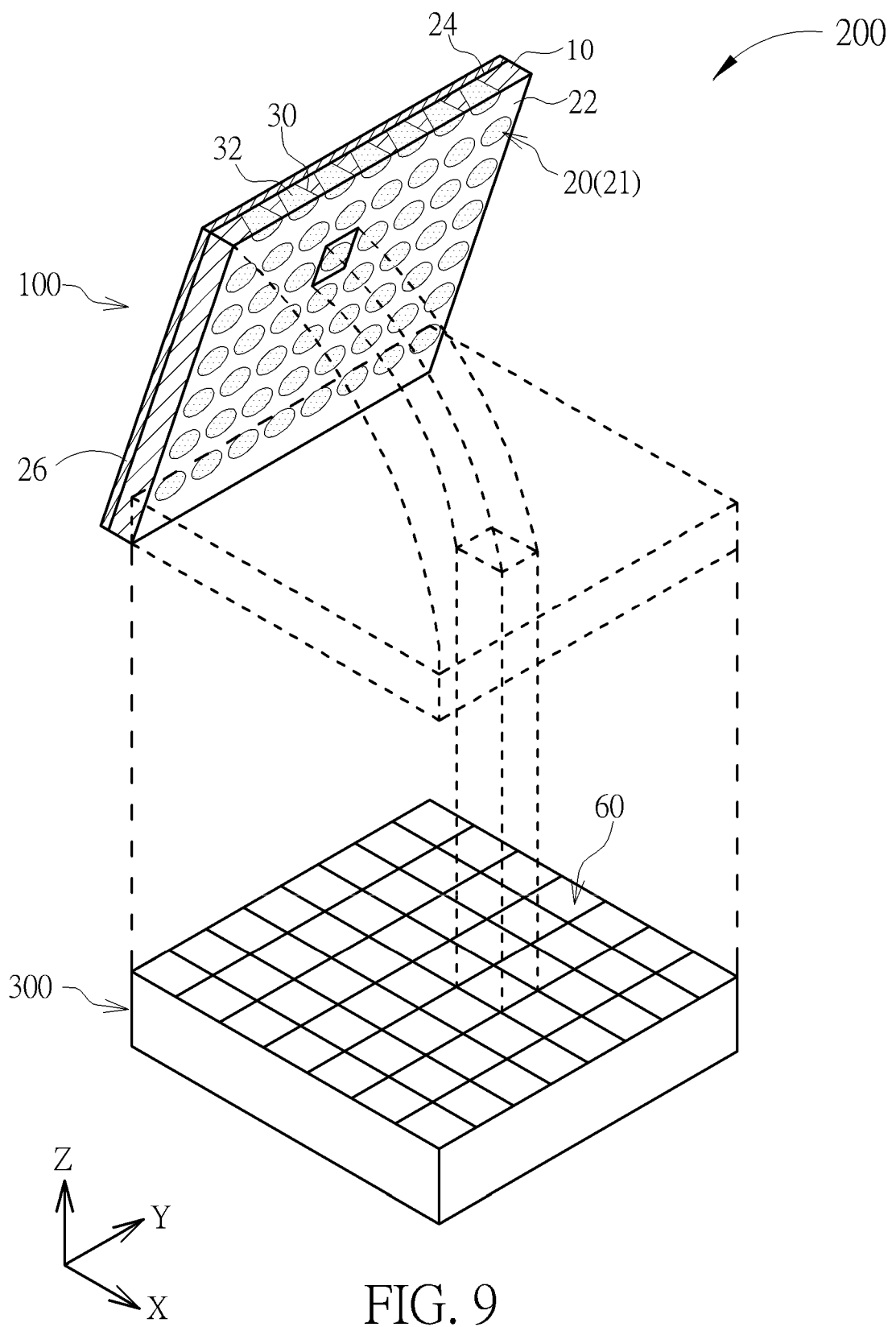
FIG. 9 is a schematic perspective diagram showing an image sensor assembly according to an embodiment of the present invention.
Figure 10:
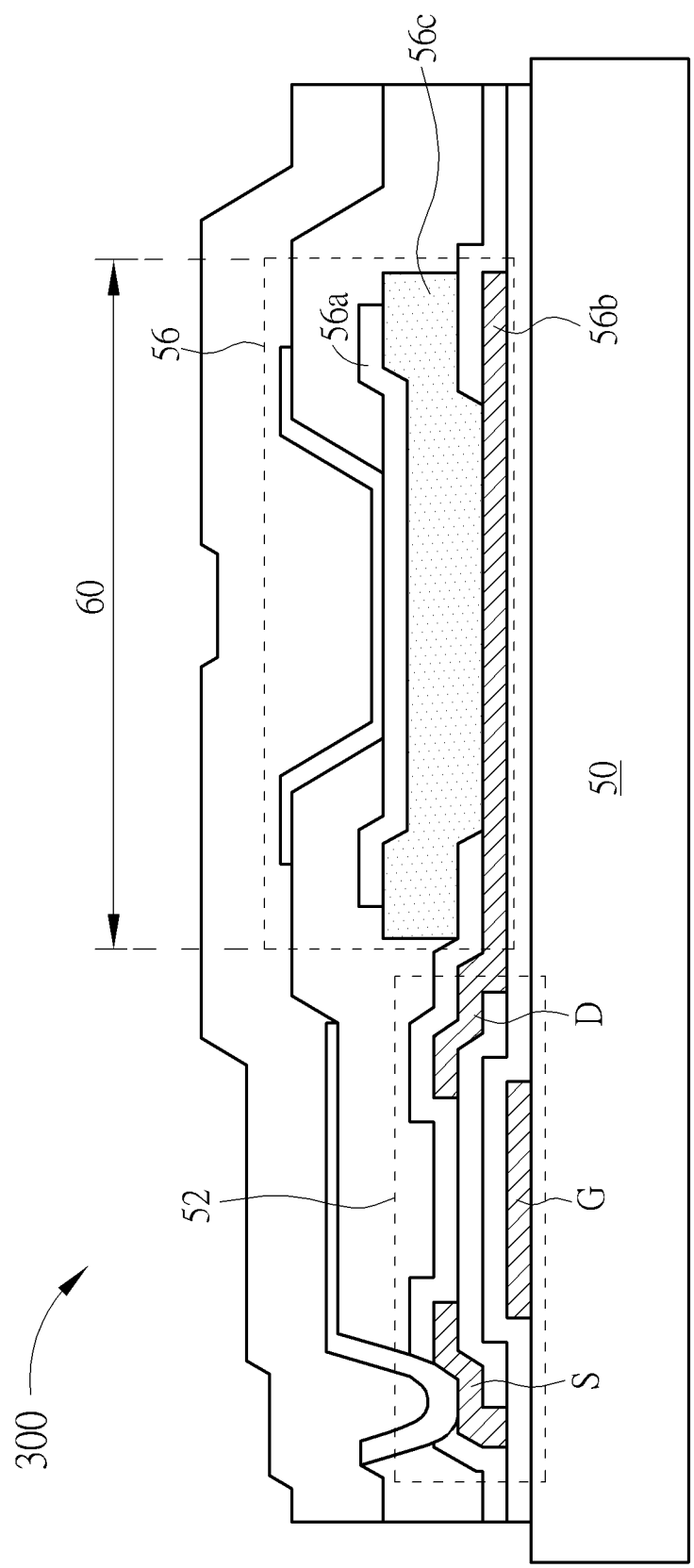
FIG. 10 is a schematic partial cross-sectional diagram showing a light sensor assembly according to an embodiment of the present invention.

Given the above, the present invention provides a conversion structure. The conversion structure includes a substrate and a plurality of conversion units. Thanks to the specific design of the sidewall of the trenches and the materials of the electromagnetic wave conversion elements, the conversion structure can have a better light concentrating ability and a better light emitting efficiency. According to another embodiment of the present invention, an image sensor assembly is provided and the structure of which is described as follows. FIG. 9 is a schematic perspective diagram showing an image sensor assembly according to an embodiment of the present invention. FIG. 10 is a schematic partial cross-sectional diagram showing a light sensor assembly according to an embodiment of the present invention. As shown in FIG. 1, FIG. 2, FIG. 9 and FIG. 10, the image sensor assembly 200 shown in FIG. 9 may be regarded as an integrated structure of the conversion structure 100 and another light sensor assembly 300. The characteristics and material properties of the conversion structure 100 disclosed in this embodiment are similar to those described in the previous embodiment, so the detailed description of which is therefore omitted. According to the present embodiment, the light sensor assembly 300 includes a plurality of sensor units. Each sensor unit has a sensing region 60. The light sensor assembly 300 faces the second surface 22 of the first substrate 10, and more specifically, the second surface 22 of the conversion structure 100 is adjacent to the light sensor assembly 300. In this configuration, the first electromagnetic waves L1 can be emitted into the conversion structure 100 through the first surface 24 and then be converted into the second electromagnetic waves L2. Finally, the second electromagnetic waves L2 may be emitted from the first openings 22a on the second surface 22 and be received by the light sensor assembly 300. Similarly, according to another embodiment of the present invention, the relative position of the light sensor assembly 300 may be changed inversely in order to meet different requirements.

As shown in FIG. 9 and FIG. 10, the light sensor assembly 300 includes a second substrate 50, a plurality of light sensor devices 56 and a plurality of switching devices 52. Each of the light sensor devices 56 is disposed respectively within each sensing region 60 on the second substrate 50. According to the present embodiment, each of the light sensor devices 56 may include an electrode 56a, an electrode 56b, and a light sensor 56c. The electrode 56b, the light sensor 56c and the electrode 56a are sequentially stacked on the second substrate 50. To put it more concretely, the switching device 52 may be a thin film transistor and the electrode 56b may be electrically connected to a drain electrode D of the thin film transistor. In this way, the signal detected by the light sensor 56c may be further transmitted to an external circuit or external controlling unit through the switching device 52. The light sensor 56c may be a PIN light diode or transistor, which is used to absorb the second electromagnetic wave having the second wavelength and to generate the corresponding light current. In addition, the switching device 52 may be turned on and off corresponding to the timing at which the first electromagnetic wave is emitted into the image sensor assembly so as to control the read out timing of the light current. The above-mentioned second substrate 50 may include a rigid substrate (such as a semiconductor substrate, a glass-fiber substrate, a glass substrate, a rigid plastic substrate, a metal substrate or a ceramic substrate), a flexible substrate or other substrates with suitable materials, but not limited thereto.

According to the present embodiment, the opening of the trench 20 in each conversion units 21 is preferably corresponding to the light sensor 56c. And the opening area of the trench 20 is preferably smaller than or equal to the area of the light sensor 56c. In other words, the light sensor 56c may cover the corresponding trench 20 along a direction perpendicular to the first substrate. In this configuration, the second electromagnetic wave emitted from each of the conversion unit 21 may be detected by the corresponding light sensor 56c and signal crosstalk among the conversion units 21 can be avoided. As shown in FIG. 2, FIG. 9 and FIG. 10, the second electromagnetic waves L2 may be concentrated by the specific geometric design of the trenches 20 and be emitted into the light sensor 56c in each of the sensing regions 60. Accordingly, if the image sensor assembly 200 is used as an X-ray sensor assembly in the field of the medical industry, the X-ray dosage emitted upon human body may be reduced in a certain degree and the negative influence on human health can be prevented. It should be noted that the second electromagnetic wave wavelength emitted from each of the conversion units 21 needs to correspond to the electromagnetic wave wavelength that is detectable by the light sensor 56c. That is to say, the material of the light sensor 56c needs to be chosen from the materials that can convert the wavelength of the first electromagnetic wave emitted from the electromagnetic wave conversion element 32. This way, the light sensor 56c may further convert the second electromagnetic wave into light current. For example, when the wavelength of the second electromagnetic wave L2 emitted from the conversion unit 21 is from the visible light spectrum, the wavelength detectable by the light sensor 56 is preferably also from the visible light spectrum. According to another embodiment of the present invention, a black matrix may be disposed in or on the second substrate of the light sensor assembly. The black matrix may have a plurality of openings corresponding to each of the sensing regions and is used to prevent two adjacent conversion units from being interrupted by a second electromagnetic wave.

Figure 11:
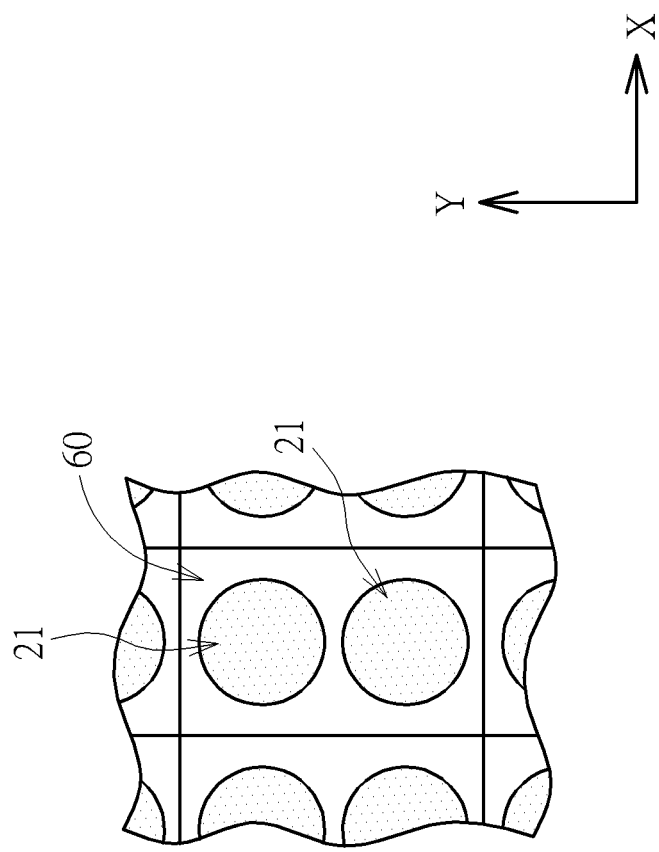
FIG. 11 and FIG. 12 are schematic diagrams showing a layout of conversion units in each sensing region according to different embodiments of the present invention.
Figure 12:
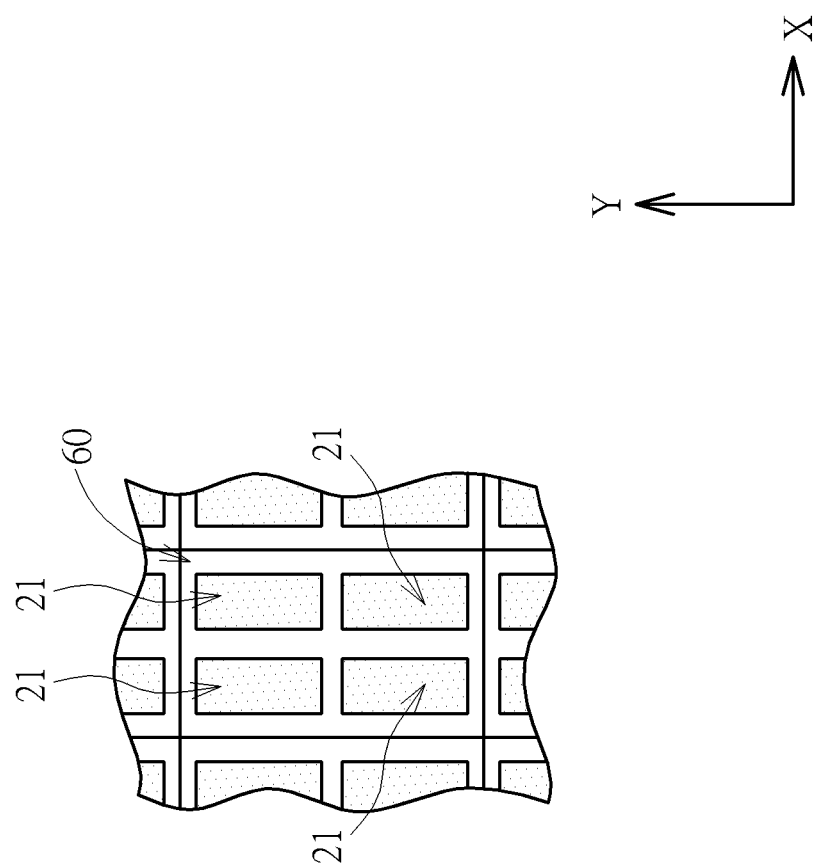

Furthermore, there may be not only one trench in the conversion unit within each of the sensing regions. That is to say, there may be more than one trench in each of the sensing regions. The detailed structure thereof is depicted in FIG. 11 and FIG. 12. FIG. 11 and FIG. 12 are schematic diagrams showing a layout of conversion units in each sensing region according to different embodiments of the present invention. As shown in FIG. 11, the conversion unit 21 in each of the sensing regions 60 has two trenches 20. The trenches 20 extend along a Y direction and each of the trenches 20 has a circular opening shape, but not limited thereto. According to another embodiment, as shown in FIG. 12, the trenches 20 in each of the sensing regions 60 may be arranged in a 2×2 matrix layout along an X direction and a Y direction. And each of the trenches 20 has a rectangular opening shape, but not limited thereto. According to other embodiments, the trenches in each of the sensing regions may have various design layouts and present various opening shapes if required.

In the above paragraphs, the conversion structure and the image sensor assembly are disclosed in detail. In the following paragraphs, a method for fabricating a conversion structure is described to provide a thorough understanding of the invention. In addition, since the configuration disclosed below is similar to that disclosed in the previous embodiments, like or similar features will usually be described with same reference numerals for ease of illustration and description thereof.

According to one embodiment of the present invention, a method for fabricating a conversion structure is provided. The method includes the following processes. Similarly to the structure shown in FIG. 2 and FIG. 9, a first substrate 10 is provided at the beginning of the manufacturing process. The first substrate 10 has a first surface 24 and a second surface 22 opposite to the first surface 24. The first substrate 10 may be a rigid substrate or a flexible substrate as described above. In a next step, a drilling process is performed. During the drilling process, a plurality of trenches 20 is formed on the second surface 22 of the first substrate 10. The trenches 20 may include through holes or blind via holes, preferably through holes. The types of drilling processes may include laser drilling, mechanical drilling, sand blasting or etching, but preferably laser drilling. Afterward, a layer of reflective film 26 is optionally adhered or deposited on the first surface 24 of the first substrate 10 and a reflective layer 30 is formed on the sidewall 28a of each of the trenches 20. The formation method of the reflective layer 30 may include electron beam deposition, plasma sputtering deposition or other suitable processes. Finally, the electromagnetic wave conversion element 32 is filled into each of the trenches 20 and a solidifying process may be carried out optionally. The electromagnetic wave conversion element 32 may include phosphorescent materials or luminescent materials which are used to absorb the first electromagnetic waves L1 having a first wavelength and emit the second electromagnetic waves L2 having a second wavelength. The main characteristic is that the electromagnetic wave conversion elements 32 may be in a power phase or be uniformly distributed in a liquid phase. In this way, the electromagnetic wave conversion elements 32 may be filled into each of the trenches 20 through a coating or an injection process. Compared with the currently-used material, which is formed through an epitaxial growth process, the filling process provided in the present invention is more convenient for manufacturing. Since the material and function of the electromagnetic wave conversion elements 32 are described in the above-mentioned embodiments, the detailed description of which is therefore omitted. After the above processes, the conversion structure 100 can be obtained.

After the achieving the conversion structure 100, the conversion structure 100 can be integrated with the light sensor assembly 300 in a way where the second surface 22 of the conversion structure 100 can face the light sensor assembly 300. Finally, an image sensor assembly 200 is obtained. The light sensor device 56 in each of the sensing region 60 is corresponding to at least a trench 20. It should be noted that, without departing from the scope and spirit of the present invention, the image sensor assembly 200 can not only be regarded as an X-rays sensor assembly, it can also be regarded as a gamma-rays, ultraviolet, visible light or infrared sensor assembly. Besides, the application field is not restricted to the medical field; it can also be used in the transportation field, semiconductor field or other industry fields.

To summarize, the present invention provides a conversion structure, an image sensor assembly and a method for fabrication a conversion structure. The process disclosed in the present invention for manufacturing the conversion structure can be carried out without the currently-used epitaxial growth process and toxic materials, the corresponding process can be more convenient and eco-friendly. In addition, owing to the specific geometric design of the conversion structure trench and the existence of the reflective film and the reflective layer, the intensity of light having a second wavelength and outputted from the conversion structure into the light sensor assembly can be increased accordingly. In this way, the change in light intensity can be determined by the light sensor devices more easily, so as to overcome the drawbacks resulting from the use of CsI:Tl, such as relatively low light conversion efficiency. In addition, since the pitch between two trenches in the conversion structure can be adjusted easily according to the pitch between two light sensor devices in the image sensor assembly, the signal crosstalk among light sensor devices can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A conversion structure, comprising:
    a substrate, having a first surface and a second surface opposite to the first surface, wherein the second surface of the substrate having a plurality of trenches penetrating the substrate;
    a plurality of electromagnetic wave conversion elements, respectively disposed in each of the trenches, wherein each of the electromagnetic wave conversion elements is used to absorb a first electromagnetic wave having a first electromagnetic wave wavelength and to emit a second electromagnetic wave having a second electromagnetic wave wavelength, and the first electromagnetic wave wavelength is shorter than the second electromagnetic wave wavelength;
    a reflective film, covering the first surface of the substrate, wherein the first electromagnetic wave penetrates the reflective film, and the reflective film is used to reflect the second electromagnetic wave; and
    a plurality of reflective layers, respectively disposed between a sidewall of each of the trenches and each of the electromagnetic wave conversion elements, wherein the reflective layers are used to reflect the second electromagnetic wave.

2. The conversion structure of claim 1, wherein each of the trenches does not penetrate the substrate.

3. The conversion structure of claim 1, wherein the trenches are arranged in an array layout.

4. The conversion structure of claim 1, wherein each of the trenches has an opening shape on the second surface, and each of the opening shapes is circular, elliptical, or polygonal.

5. The conversion structure of claim 1, wherein the sidewall of each of the trenches is not perpendicular to the second surface.

6. The conversion structure of claim 1, wherein each of the trenches comprises a first opening located on the second surface and a second opening located on the first surface, wherein an opening area of each of the first openings is larger than an opening area of each of the second openings.

7. The conversion structure of claim 1, wherein one of the electromagnetic wave conversion elements comprises a scintillator, a phosphorescent material, or a luminescent material.

8. The conversion structure of claim 7, wherein one of the electromagnetic wave conversion elements is a mixture or a compound of materials comprising a scintillator, phosphorescent material, or luminescent material.

9. An image sensor assembly, comprising:
    a conversion structure, comprising:
        a first substrate, having a first surface and a second surface opposite to the first surface, wherein the second surface of the substrate has a plurality of trenches penetrating the substrate;
        a plurality of electromagnetic wave conversion elements, respectively disposed in each of the trenches, wherein each of the electromagnetic wave conversion elements is used to absorb a first electromagnetic wave having a first electromagnetic wave wavelength and to emit a second electromagnetic wave having a second electromagnetic wave wavelength, and the first electromagnetic wave wavelength is shorter than the second electromagnetic wave wavelength;
        a reflective film, covering on the first surface of the substrate, wherein the first electromagnetic wave penetrates the reflective film, and the reflective film is used to reflect the second electromagnetic wave; and
        a plurality of reflective layers, respectively disposed between a sidewall of each of the trenches and each of the electromagnetic wave conversion elements, wherein the reflective layers are used to reflect the second electromagnetic waves; and
    a light sensor assembly, disposed opposite to the second surface of the first substrate and comprising a plurality of sensing regions, the light sensor assembly comprising:
        a second substrate; and
        a plurality of light sensor devices, respectively disposed within each of the sensing regions on the second substrate.

10. The image sensor assembly of claim 9, wherein the light sensor assembly further comprises a plurality of switching devices respectively electrically connected to each of the light sensor devices.

11. The image sensor assembly of claim 9, wherein each of the light sensing regions is corresponding to at least one of the trenches.

12. The image sensor assembly of claim 9, wherein the trenches are arranged in an array layout.

13. A method of fabrication a conversion structure, comprising:
- providing a substrate having a first surface and a second surface opposite to the first surface;
- forming a plurality of trenches penetrating the substrate on the second surface;
- depositing a reflective film on the first surface of the substrate;
- forming a reflective layer on a sidewall of each of the trenches; and
- filling an electromagnetic wave conversion element into each of the trenches, wherein each of the electromagnetic wave conversion elements is used to absorb a first electromagnetic wave having a first electromagnetic wave wavelength and to emit a second electromagnetic wave having a second electromagnetic wave wavelength, and the first electromagnetic wave wavelength is shorter than the second electromagnetic wave wavelength.

14. The method of claim 13, wherein the trenches do not penetrate the substrate.

* * * * *